United States Patent
Ollmann et al.

(10) Patent No.: US 10,605,847 B1
(45) Date of Patent: Mar. 31, 2020

(54) VERIFICATION OF INSTALLATION OF VEHICLE STARTER DISABLE AND ENABLE CIRCUIT

(71) Applicant: Spireon, Inc., Irvine, CA (US)

(72) Inventors: Steve Ollmann, Irving, TX (US); Michael Callinan, Irvine, CA (US); Charles F. Raasch, Foothill Ranch, CA (US); George Clark, Irving, TX (US)

(73) Assignee: Spireon, Inc., Irvine, CA (US)

( * ) Notice: Subject to any disclaimer, the term of this patent is extended or adjusted under 35 U.S.C. 154(b) by 0 days.

(21) Appl. No.: 16/267,443

(22) Filed: Feb. 5, 2019

Related U.S. Application Data

(60) Provisional application No. 62/649,319, filed on Mar. 28, 2018.

(51) Int. Cl.

| | |
|---|---|
| *G01R 31/00* | (2006.01) |
| *B60R 16/023* | (2006.01) |
| *B60R 25/102* | (2013.01) |
| *B60R 25/10* | (2013.01) |
| *B60R 25/045* | (2013.01) |
| *G01R 31/04* | (2006.01) |

(52) U.S. Cl.
CPC ........ *G01R 31/007* (2013.01); *B60R 16/0232* (2013.01); *B60R 25/045* (2013.01); *B60R 25/102* (2013.01); *B60R 25/1003* (2013.01); *G01R 31/005* (2013.01); *G01R 31/006* (2013.01); *G01R 31/04* (2013.01); *G01R 31/041* (2013.01)

(58) Field of Classification Search
CPC .. B60R 25/045; G01R 31/005; G01R 31/006; G01R 31/007; G01R 31/04; G01R 31/041; G01R 31/371; G01R 31/382; G01R 31/3835

See application file for complete search history.

(56) References Cited

U.S. PATENT DOCUMENTS

| | | |
|---|---|---|
| 6,025,774 A | 2/2000 | Forbes |
| 6,249,217 B1 | 6/2001 | Forbes |
| 7,031,835 B2 | 4/2006 | Flick |

(Continued)

FOREIGN PATENT DOCUMENTS

| | | |
|---|---|---|
| CA | 2683208 A1 | 11/2008 |
| CA | 2837320 A1 | 11/2012 |

(Continued)

*Primary Examiner* — Benyam Haile

(74) *Attorney, Agent, or Firm* — Luedeka Neely Group, P.C.

(57) ABSTRACT

A verification procedure is performed when a tracking device is newly installed in a vehicle. The procedure involves transmitting a command to the tracking device to either disable or enable the vehicle starter. The installer is then prompted to engage the starter to start the vehicle. The tracking device then monitors the voltages on the vehicle's ignition wire and starter disable and starter enable wires going to a starter relay. The tracking device also monitors the state of a starter relay control wire. Measurement of the proper voltages on these wires provides verification that the tracking device has been connected properly. Continuing to monitor these voltages after installation provides an indication when a driver engages the starter in an attempt to start the vehicle.

11 Claims, 3 Drawing Sheets

(56) References Cited

U.S. PATENT DOCUMENTS

| | | |
|---|---|---|
| 7,102,510 B2 | 9/2006 | Boling et al. |
| 7,215,282 B2 | 5/2007 | Boling et al. |
| 7,366,551 B1 | 4/2008 | Hartley |
| 7,546,151 B2 | 6/2009 | Hartley |
| 7,675,423 B2 | 3/2010 | Boling et al. |
| 7,818,098 B2 | 10/2010 | Koepf et al. |
| 7,830,305 B2 | 11/2010 | Boling et al. |
| 7,970,496 B2 | 6/2011 | Koepf et al. |
| 8,018,332 B2 | 9/2011 | Boling et al. |
| 8,368,561 B2 | 2/2013 | Welch et al. |
| 8,452,673 B2 | 5/2013 | Boling et al. |
| 8,462,021 B2 | 6/2013 | Welch et al. |
| 8,510,200 B2 | 8/2013 | Pearlman et al. |
| 8,760,274 B2 | 6/2014 | Boling et al. |
| 8,933,802 B2 | 1/2015 | Baade |
| 9,008,894 B2 | 4/2015 | Bishop et al. |
| 9,060,213 B2 | 6/2015 | Jones |
| 9,070,271 B2 | 6/2015 | Baade et al. |
| 9,316,737 B2 | 4/2016 | Baade |
| 9,332,404 B2 | 5/2016 | Boling et al. |
| 9,516,394 B2 | 12/2016 | Carlo et al. |
| 9,551,788 B2 | 1/2017 | Epler |
| 9,779,379 B2 | 10/2017 | Hall et al. |
| 9,779,449 B2 | 10/2017 | Meyer et al. |
| 10,089,598 B2 | 10/2018 | Reeder et al. |
| 10,169,822 B2 | 1/2019 | Jarvis et al. |
| 10,223,744 B2 | 3/2019 | Brady et al. |
| 10,232,823 B1 | 3/2019 | Bobay et al. |
| 10,255,824 B2 | 4/2019 | Pearlman et al. |
| 2002/0013660 A1* | 1/2002 | Flick .................. B60R 25/04 701/519 |
| 2005/0026627 A1 | 2/2005 | Boling et al. |
| 2005/0215194 A1 | 9/2005 | Boling et al. |
| 2006/0007038 A1 | 1/2006 | Boling et al. |
| 2007/0152844 A1 | 7/2007 | Hartley et al. |
| 2008/0147245 A1 | 6/2008 | Koepf et al. |
| 2008/0186135 A1 | 8/2008 | Boling et al. |
| 2008/0198018 A1 | 8/2008 | Hartley |
| 2008/0287151 A1* | 11/2008 | Fjelstad .................. H04W 4/14 455/466 |
| 2009/0043445 A1 | 2/2009 | Bishop et al. |
| 2009/0224966 A1 | 9/2009 | Boling et al. |
| 2010/0103042 A1 | 4/2010 | Bishop et al. |
| 2010/0299020 A1 | 11/2010 | Koepf et al. |
| 2011/0016514 A1 | 1/2011 | Carlo et al. |
| 2011/0093159 A1 | 4/2011 | Boling et al. |
| 2011/0241903 A1 | 10/2011 | Welch et al. |
| 2012/0299721 A1 | 11/2012 | Jones |
| 2012/0299755 A1 | 11/2012 | Jones |
| 2013/0088371 A1 | 4/2013 | Welch et al. |
| 2013/0127617 A1 | 5/2013 | Baade et al. |
| 2013/0141249 A1 | 6/2013 | Pearlman et al. |
| 2013/0144770 A1 | 6/2013 | Boling et al. |
| 2013/0144771 A1 | 6/2013 | Boling et al. |
| 2013/0144805 A1 | 6/2013 | Boling et al. |
| 2013/0147617 A1 | 6/2013 | Boling et al. |
| 2013/0159214 A1 | 6/2013 | Boling et al. |
| 2013/0185193 A1 | 7/2013 | Boling et al. |
| 2013/0302757 A1 | 11/2013 | Pearlman et al. |
| 2014/0012634 A1 | 1/2014 | Pearlman et al. |
| 2014/0052605 A1 | 2/2014 | Beerle et al. |
| 2014/0074692 A1 | 3/2014 | Beerle et al. |
| 2014/0095061 A1 | 4/2014 | Hyde |
| 2014/0125500 A1 | 5/2014 | Baade |
| 2014/0125501 A1 | 5/2014 | Baade |
| 2014/0280658 A1 | 9/2014 | Boling et al. |
| 2015/0006207 A1 | 1/2015 | Jarvis et al. |
| 2015/0019270 A1 | 1/2015 | Jarvis et al. |
| 2015/0024727 A1 | 1/2015 | Hale-Pletka et al. |
| 2015/0066362 A1 | 3/2015 | Meyer et al. |
| 2015/0067312 A1 | 3/2015 | Lewandowski et al. |
| 2015/0095255 A1 | 4/2015 | Hall et al. |
| 2015/0186991 A1 | 7/2015 | Meyer et al. |
| 2015/0356497 A1 | 12/2015 | Reeder et al. |
| 2016/0225072 A1 | 8/2016 | Brady et al. |
| 2016/0282466 A1 | 9/2016 | Epler |
| 2017/0262717 A1 | 9/2017 | Drazan et al. |
| 2018/0300967 A1 | 10/2018 | Winograd |
| 2018/0352198 A1 | 12/2018 | Raasch et al. |
| 2019/0005442 A1 | 1/2019 | Reeder et al. |
| 2019/0061692 A1 | 2/2019 | Bobay et al. |

FOREIGN PATENT DOCUMENTS

| | | |
|---|---|---|
| CA | 2856796 A1 | 5/2013 |
| CA | 2867447 A1 | 9/2013 |
| CA | 2826902 A1 | 3/2014 |
| CA | 2828835 A1 | 4/2014 |
| CA | 2832185 A1 | 5/2014 |
| CA | 2846134 A1 | 9/2014 |
| MX | 2009011420 A | 3/2010 |
| MX | 2010001545 A | 8/2010 |
| WO | 2005086933 A2 | 9/2005 |
| WO | 2006028995 A2 | 3/2006 |
| WO | 2006028995 A3 | 2/2007 |
| WO | 2007146449 A2 | 12/2007 |
| WO | 2007146449 A3 | 10/2008 |
| WO | 2008121612 A1 | 10/2008 |
| WO | 2008144411 A1 | 11/2008 |
| WO | 2005086933 A3 | 12/2008 |
| WO | 2009021117 A1 | 2/2009 |
| WO | 2010047887 A2 | 4/2010 |
| WO | 2012162358 A1 | 11/2012 |
| WO | 2012162450 A1 | 11/2012 |
| WO | 2013078291 A1 | 5/2013 |
| WO | 2013138798 A1 | 9/2013 |

* cited by examiner

VERIFICATION OF INSTALLATION OF VEHICLE STARTER DISABLE AND ENABLE CIRCUIT

CROSS-REFERENCE TO RELATED APPLICATIONS

This application claims priority to provisional patent application Ser. No. 62/649,319 filed Mar. 28, 2018, the entire contents of which are incorporated herein by reference.

FIELD

This invention relates to the field of asset monitoring. More particularly, this invention relates to a system for verifying the installation of a starter disable/enable circuit in a vehicle.

BACKGROUND

Vehicle tracking devices are often installed in vehicles that serve as collateral for vehicle loans. Typically, such tracking devices include circuitry wired to the vehicle's ignition system that provides for disabling and enabling the vehicle's starter based on commands that are wirelessly transmitted to the tracking device. The ability to implement the starter disable/enable function relies upon the proper installation of the tracking device in the vehicle. If the installer makes a mistake in the wiring of the tracking device to the vehicle ignition system, it may be impossible to disable or reenable the vehicle starter when needed. In prior systems, the installer's mistake may not have been detected until the first time a starter disable command is transmitted to the tracking device and it has no effect.

What is needed, therefore, is a system for verifying proper connection of starter disable/enable circuitry at the time of the installation.

SUMMARY

As described herein, a verification procedure is performed when a tracking device is newly installed in a vehicle. The procedure involves transmitting a command to the tracking device to either disable or enable the vehicle starter. The installer is then prompted to engage the starter to start the vehicle. The tracking device then monitors the voltages on the vehicle's Ignition wire and the StarterDisable and StarterEnable wires. The tracking device also monitors the state of the StarterRelay wire. The proper voltages on these wires provides verification that the tracking device has been connected properly. Continuing to monitor these voltages after installation provides an indication when a driver engages the starter in an attempt to start the vehicle.

In preferred embodiments, when the starter is engaged, the tracking device transmits a message indicating the state of the starter as being either Starter-Engaged-While-Disabled or Starter-Engaged-While-Enabled. The contents of this message also may indicate the voltage levels on the wires being monitored along with the state of StarterRelay. Thus, the message provides both verification that the tracking device is installed properly and that the driver tried to start the vehicle.

Some embodiments described herein are directed to a method for verifying that a vehicle tracking device has been correctly connected to a vehicle ignition, a vehicle starter motor, and a starter relay, wherein the starter relay has a starter disabled switch position and a starter enabled switch position. The method includes:

(a) transmitting a starter disable command to the vehicle tracking device via a wireless communication network;

(b) in response to the starter disable command, the vehicle tracking device setting a starter relay control connection to a first state to control the starter relay to direct a starting voltage from the vehicle ignition to the starter disabled switch position;

(c) while the vehicle ignition is in a start position, monitoring the starter relay control connection, a first voltage level on a first connection to the starter disabled switch position, a second voltage level on a second connection to the starter enabled switch position, and a third voltage level on an ignition connection to the vehicle ignition;

(d) generating a first report message indicating a state of the starter relay control connection and the first, second, and third voltage levels; and (e) transmitting the first report message to a mobile communication device.

In some embodiments, the method includes generating the first report message to indicate that the vehicle tracking device has been connected correctly when the starter relay control connection is in the first state, the first voltage level is the starting voltage, the second voltage level is not the starting voltage, and the third voltage level is an ignition-on voltage.

In some embodiments, the method includes generating the report message to include an indication of the first voltage level, the second voltage level, and the third voltage level, and the state of the starter relay control connection.

In some embodiments, the method includes sending a message via the wireless communication network to a mobile communication device of a person who is tasked with verifying that the vehicle tracking device has been correctly wired to the vehicle ignition, which message prompts the person to engage the vehicle starter motor.

In some embodiments, the method includes:

(f) transmitting a starter enable command to the vehicle tracking device via the wireless communication network;

(g) in response to the starter enable command, the vehicle tracking device setting the starter relay control connection to a second state to control the starter relay to direct the starting voltage from the vehicle ignition to the starter enabled switch position;

(h) while the vehicle ignition is in the start position, monitoring the starter relay control connection, the first voltage level on the first connection to the starter disabled switch position, the second voltage level on the second connection to the starter enabled switch position, and the third voltage level on the ignition connection;

(i) generating a second report message indicating the state of the starter relay control connection and the first, second, and third voltage levels; and (j) transmitting the second report message to the mobile communication device.

In some embodiments, the method includes generating the second report message to indicate that the vehicle tracking device has been connected correctly when the starter relay control connection is in the second state, the second voltage level is the starting voltage, the first voltage level is not the starting voltage, and the third voltage level is an ignition-on voltage.

In another aspect, embodiments of the invention provide a vehicle tracking device for installation in a vehicle having an ignition system and a starter relay connected to the ignition system for disabling and enabling a starter of the vehicle. The vehicle tracking device includes a location sensor, a wireless transceiver, a starter disable/enable circuit, and a processor. The location sensor generates location information indicating a location of the vehicle tracking device. The wireless transceiver wirelessly communicates information between the vehicle tracking device and a wireless communication network. The starter disable/enable circuit monitors connections between the vehicle tracking device and the ignition system of the vehicle and generates state information based on the connections. The connections include an ignition connection, a starter relay control connection, a first connection to a starter disabled switch position of the starter relay, and a second connection to a starter enabled switch position of the starter relay. The processor receives the state information from the starter disable/enable circuit and generates a report message indicating states of one or more of the connections. The wireless transceiver communicates the report message via the wireless information network.

In some embodiments, the states of the starter relay control connection include a first state in which the starter relay directs a starting voltage from the vehicle ignition system to the starter disabled switch position, and a second state in which the starter relay directs the starting voltage from the vehicle ignition system to the starter enabled switch position.

In some embodiments, the processor generates the report message to indicate that the vehicle tracking device has been correctly connected when the starter relay control connection is in the first state, the first connection receives the starting voltage, the second connection does not receive the starting voltage, and the ignition connection receives an ignition-on voltage.

In some embodiments, the processor generates the report message to indicate that the vehicle tracking device has been correctly connected when the starter relay control connection is in the second state, the second connection receives the starting voltage, the first connection does not receive the starting voltage, and the ignition connection receives an ignition-on voltage.

In some embodiments, the wireless transceiver communicates a message via the wireless communication network to a mobile communication device of a person who is tasked with verifying that the vehicle tracking device has been correctly connected in the vehicle ignition, which message prompts the person to engage the vehicle starter.

In another aspect, embodiments of the invention provide an apparatus for verifying that a vehicle tracking device has been correctly connected to a vehicle ignition, a vehicle starter motor, and a starter relay, wherein the starter relay has a starter disabled switch position and a starter enabled switch position. The apparatus includes a central server and a vehicle tracking device. The central server, which communicates with the vehicle tracking device via a wireless communication network, executes instructions to send a starter disable command to the vehicle tracking device via the wireless communication network. The central server also executes instructions to send a message via the wireless communication network to a mobile communication device of a person who is tasked with verifying that the vehicle tracking device has been correctly connected to the vehicle ignition, which message prompts the person to put the vehicle ignition in a start position. The vehicle tracking device includes a location sensor, a wireless transceiver, a starter disable/enable circuit, and a processor. The location sensor generates location information indicating a location of the vehicle tracking device. The wireless transceiver receives the starter disable command via the wireless communication network. In response to the starter disable command, the starter disable/enable circuit sets a starter relay control connection to a first state in which the starter relay directs a starting voltage from the vehicle ignition to the starter disabled switch position of the starter relay. While the vehicle ignition is in the start position, the starter disable/enable circuit monitors connections between the vehicle tracking device and the ignition system of the vehicle and generates state information based on the connections. The connections include an ignition connection, the starter relay control connection, a first connection to the starter disabled switch position of the starter relay, and a second connection to the starter enabled switch position of the starter relay. The processor receives the state information from the starter disable/enable circuit and generates a first report message indicating states of one or more of the connections. The wireless transceiver communicates the first report message via the wireless information network.

In some embodiments, the processor generates the first report message to indicate that the vehicle tracking device has been correctly connected when the starter relay control connection is in the first state, the first connection receives the starting voltage, the second connection does not receive the starting voltage, and the ignition connection receives an ignition-on voltage.

In some embodiments, the central server executes instructions to send a starter enable command to the vehicle tracking device. The wireless transceiver of the vehicle tracking device receives the starter enable command via the wireless communication network. In response to the starter enable command, the starter disable/enable circuit sets the starter relay control connection to a second state in which the starter relay directs the starting voltage from the vehicle ignition to the starter enabled switch position of the starter relay. The processor receives the state information from the starter disable/enable circuit and generates a second report message indicating states of one or more of the connections. The wireless transceiver communicates the second report message via the wireless information network.

In some embodiments, the processor generates the second report message to indicate that the vehicle tracking device has been correctly connected when the starter relay control connection is in the second state, the second connection receives the starting voltage, the first connection does not receive the starting voltage, and the ignition connection receives an ignition-on voltage.

In various embodiments, the vehicle may be a gasoline-powered vehicle, a gasoline/electric hybrid vehicle, or an electric vehicle.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
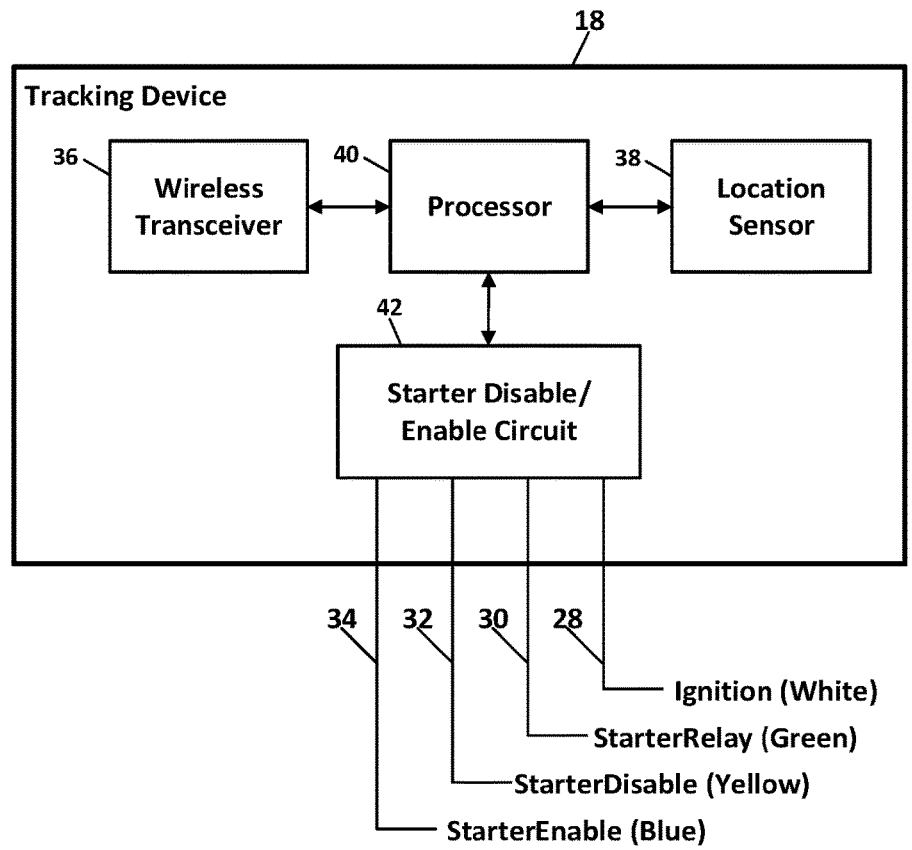
FIG. 1 depicts a functional block diagram of a vehicle tracking device according to a preferred embodiment.

FIG. 1 depicts an exemplary embodiment of a vehicle tracking device 18, such as may be used to track the location of a vehicle that is collateral for a loan. The vehicle tracking device 18 includes a location sensor 38, a processor 40, a wireless transceiver 36, and a starter disable/enable circuit 42, all disposed within a small housing that may be installed beneath the dashboard of a vehicle, within the engine compartment, or in another location in the vehicle. The location sensor 38 is preferably a Global Positioning System (GPS) receiver that generates vehicle location coordinates based on timing signals from GPS satellites. The wireless transceiver 36 is preferably a cellular data transceiver for communicating data across a wireless communication network. The processor 40 executes commands for processing information from the starter disable/enable circuit 42, for generating messages based thereon, and for providing the messages to the wireless transceiver 36 for communication via the network.

The starter disable/enable circuit 42 monitors voltages on four wires that are connected to the vehicle's ignition system during installation of the tracking device 18. These wires include an ignition wire 28, a StarterRelay wire 30, a StarterDisable wire 32, and a StarterEnable wire 34. The states of these four wires, which are also referred to herein as "connections," are provided to the processor 40 for processing as described in more detail hereinafter.

Figure 2:
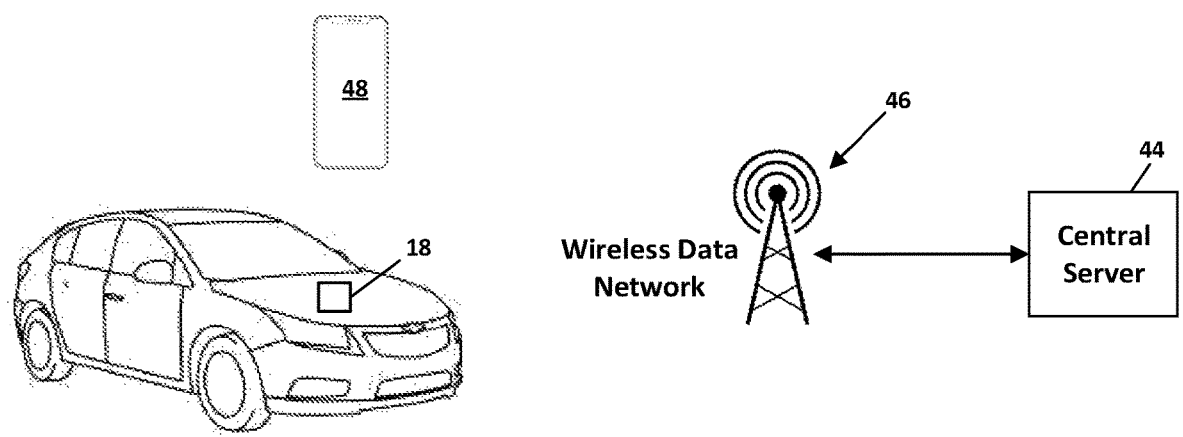
FIG. 2 depicts a central server in communication with a vehicle tracking device via a wireless data network according to a preferred embodiment.

As depicted in FIG. 2, the vehicle tracking device 18 may be installed in a vehicle that is part of the inventory of an automobile dealership or that has been purchased and serves as collateral for a loan. The wireless transceiver 36 in the tracking device 18 communicates data via the wireless data network 46 to and from a central server 44. In a preferred embodiment, the central server 44 is provided by a vehicle tracking service provider entity. A person employed by the automobile dealership who is responsible for verifying proper installation of the tracking device 18 into the vehicle uses a mobile communication device 48, which may be a smartphone, for sending and receiving messages to and from the central server 44 or to and from the vehicle tracking device 18 via the data network 46.

Figure 3:
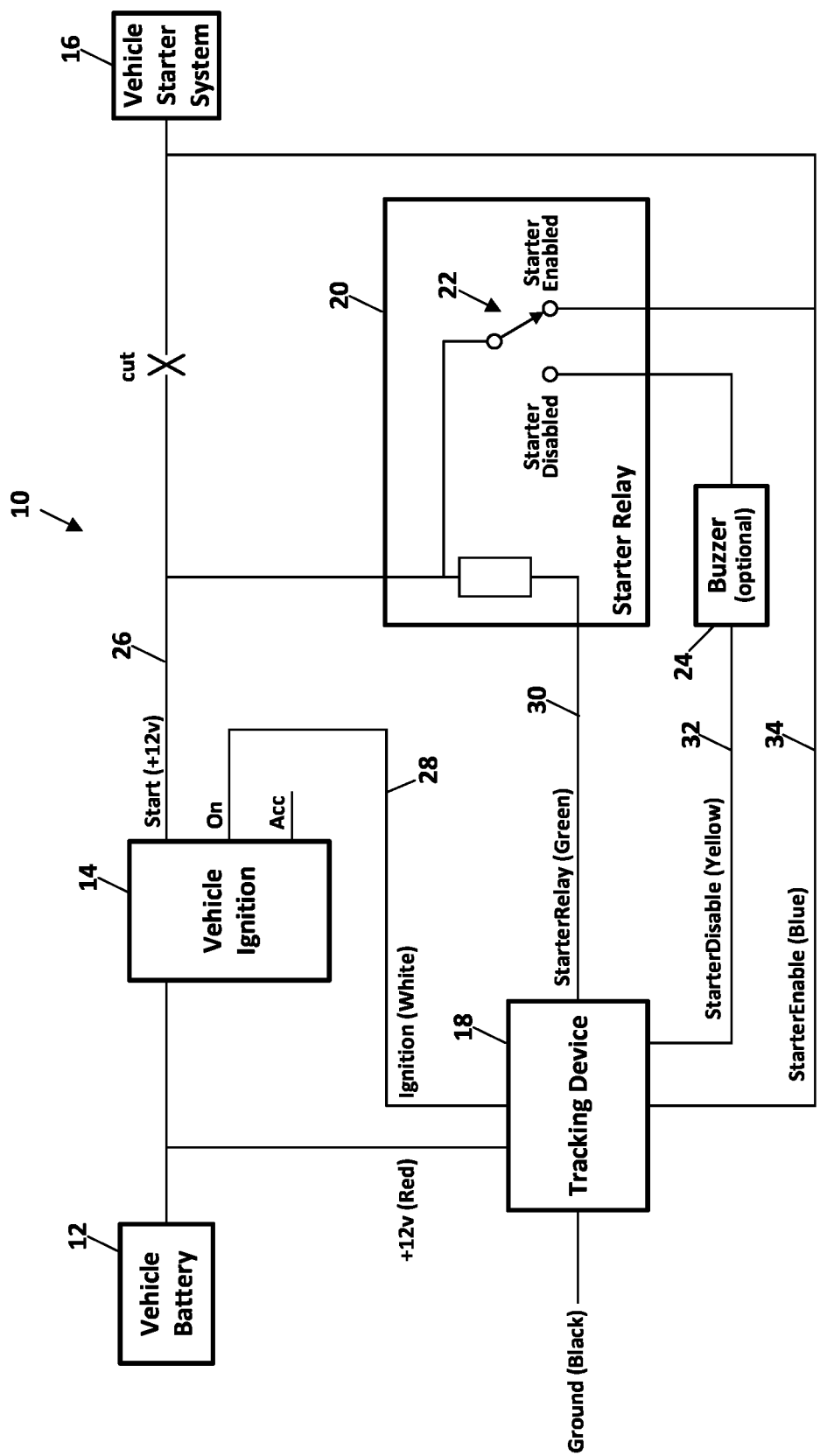
FIG. 3 depicts a functional block diagram of a vehicle tracking device wired to a vehicle ignition and starter according to a preferred embodiment.

FIG. 3 depicts a proper connection of the vehicle tracking device 18 to the vehicle's ignition system 10. As shown, the tracking device 18 receives power (+12 v) from the vehicle battery 12 and is connected to the ignition wire 28 from the vehicle ignition 14. Depending on the content of received commands, the tracking device 18 sets the state of StarterRelay 30 to either Starter Disabled or Starter_Enabled to control the state of a relay switch 22 within a starter relay 20. When the state of StarterRelay 30 is Starter Disabled, the switch 22 is set to the starter disabled position. When the state of StarterRelay 30 is Starter_Enabled, the switch 22 is set to the starter enabled position. When the switch 22 is in the starter enabled position, +12 v on the start wire 26 from the vehicle ignition 14 is provided to the vehicle starter system 16 and to the StarterEnable wire 34 connected to the tracking device 18. In gasoline-powered vehicles or gasoline/electric hybrids, the vehicle starter system 16 comprises a starter motor. When the switch 22 is in the starter disabled position, +12 v on the start wire 26 is not provided to the vehicle starter system 16, but is provided to the StarterDisable wire 32 connected to the tracking device 18. In some embodiments, a buzzer 24 is activated when +12 v is on the start wire 26 and the switch 22 is in the starter disabled position.

Figure 4:
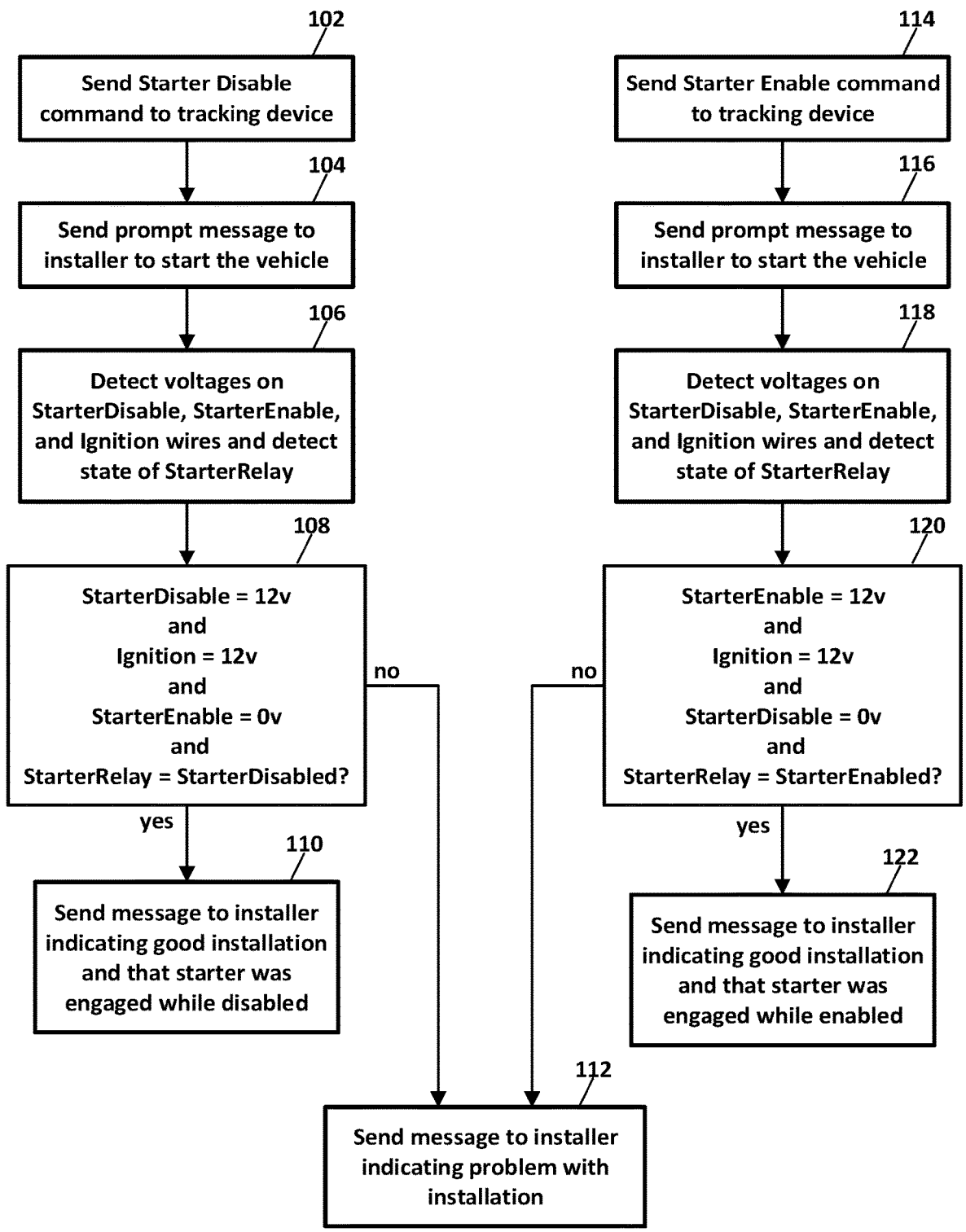
FIG. 4 depicts a method for verifying the correct wiring of a vehicle tracking device to a vehicle ignition and starter according to a preferred embodiment.

FIG. 4 depicts a process for verifying the proper connection of the tracking device 18 to the vehicle's ignition system 10. After the tracking device 18 has been installed, a starter disable command is sent from the central server 44 or from the mobile communication device 48 via the wireless network 46 to the tracking device 18 (step 102). In response to this command, the processor 40 in the tracking device 18 causes the starter disable/enable circuit 42 to set the state of StarterRelay 30 to Starter Disabled. If the wiring installation is correct, this should result in the relay switch 22 of the starter relay 20 being set to the starter disabled position. The central server 44 then sends a message via the wireless network 46 to the mobile device 48 of the person who is verifying the installation, which message prompts the person to try to start the vehicle (step 104). As the person activates the vehicle ignition 14, the starter disable/enable circuit 42 measures voltages on the ignition wire 28, the StarterRelay wire 30, the StarterDisable wire 32, and the StarterEnable wire 34 and sets a state value for each wire depending on the voltage measured (step 106). If the installation was done correctly, there should be +12 v on the ignition wire 28 (state=1), +12 v on the StarterDisable wire 32 (state=1), 0 v on the StarterEnable wire 34 (state=0), and the state of the StarterRelay wire 30 should be Starter Disabled. If these states are all detected (step 108), the system has passed the installation verification test. If any other states are detected, the system has failed the test. In either event, the processor 40 of the tracking device 18 generates a test report message that preferably indicates the pass/fail condition, the detected states of the four wires, and an indication of which wire or wires have an incorrect state and the possible cause (step 110). Examples of the content of test report messages for various pass and fail conditions when StarterRelay 30 is set to Starter Disable are listed below in Table 1 (ignition-on/start states 1-8). In a preferred embodiment, the test report message is sent as a push notification via the wireless network 46 to the mobile device 48 of the person responsible for verifying proper installation of the tracking device 18 (step 112).

With continued reference to FIG. 4, after the tracking device 18 has been installed, a starter enable command is sent from the central server 44 via the wireless network 46 to the tracking device 18 (step 114). In response to this command, the processor 40 in the tracking device 18 causes the ignition disable circuit 42 to set the state of StarterRelay 30 to Starter_Enabled. If the wiring installation is correct, this should result in the relay switch 22 of the starter relay 20 being set to the starter enabled position. The central server 44 or the vehicle tracking device 18 then sends a message via the wireless network 46 to the mobile device 48 of the person who is verifying the installation, which message prompts the person to try to start the vehicle (step 116). As the person activates the vehicle ignition 14, the starter disable/enable circuit measures voltages on the ignition wire 28, the StarterRelay wire 30, the StarterDisable wire 32, and the StarterEnable wire 34 and sets a state value for each wire depending on the voltage measured (step 118). If the installation was done correctly, there should be +12 v on the ignition wire 28 (state=1), 0 v on the StarterDisable wire 32 (state=0), +12 v on the StarterEnable wire 34 (state=1), and the state of the StarterRelay wire 30 should be Starter_Enabled. If these states are all detected (step 120), the system has passed the installation verification test. If any other states are detected, the system has failed the test. In either event, the processor 40 of the tracking device 18 generates a test report message that preferably indicates the pass/fail condition, the detected states of the four wires, and an indication of which wire or wires have an incorrect state and the possible cause (step 122). Examples of the content of test report messages for various pass and fail conditions when StarterRelay 30 is set to Starter Enable are listed below in Table 1 (ignition-on/start states 9-16). In a preferred embodiment, the test report message is sent as a push notification via the wireless network 46 to the mobile device 48 of the person responsible for verifying proper installation of the tracking device 18 (step 122).

embodiments, these commands originate from the mobile device 48. It will be appreciated that the invention is not limited to any particular device as originating the commands to disable or enable the starter.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when

TABLE 1

| | Ignition State | Starter Relay | Ignition Wire | Starter Disable Wire | Starter Enable Wire | Test Result |
|---|---|---|---|---|---|---|
| 1 | on | disabled | 0 | 0 | 0 | Fail - Ignition wire not connected to Ignition On |
| 2 | and | | 0 | 0 | 1 | Fail - Ignition wire not connected to Ignition On |
| 3 | start | | 0 | 1 | 0 | Fail - Ignition wire not connected to Ignition On |
| 4 | | | 0 | 1 | 1 | Fail - Ignition wire not connected to Ignition On |
| 5 | | | 1 | 0 | 0 | Fail - StarterDisable should be 1 |
| 6 | | | 1 | 0 | 1 | Fail - Ignition to starter wire not cut, and StarterDisable should be 1 |
| 7 | | | 1 | 1 | 0 | Pass |
| 8 | | | 1 | 1 | 1 | Fail - Ignition to starter wire not cut |
| 9 | | enabled | 0 | 0 | 0 | Fail - Ignition wire not connected to Ignition On, and StarterEnable should be 1 |
| 10 | | | 0 | 0 | 1 | Fail - Ignition wire not connected to Ignition On |
| 11 | | | 0 | 1 | 0 | Fail - Ignition wire not connected to Ignition On, and StarterEnable should be 1 |
| 12 | | | 0 | 1 | 1 | Fail - Ignition wire not connected to Ignition On |
| 13 | | | 1 | 0 | 0 | Fail - StarterEnable should be 1; wire not connected properly to starter relay |
| 14 | | | 1 | 0 | 1 | Pass |
| 15 | | | 1 | 1 | 0 | Fail - StarterEnable should be 1; wire not connected properly to starter relay |
| 16 | | | 1 | 1 | 1 | Fail - StarterDisable should be 0 |
| 17 | off | disabled | 0 | 0 | 0 | Pass |
| 18 | | | 0 | 0 | 1 | Fail - StarterEnable should be 0 |
| 19 | | | 0 | 1 | 0 | Fail - StarterDisable should be 0 |
| 20 | | | 0 | 1 | 1 | Fail - StarterEnable and StarterDisable should be 0 |
| 21 | | | 1 | 0 | 0 | Fail - Ignition wire should be 0 |
| 22 | | | 1 | 0 | 1 | Fail - Ignition wire should be 0 |
| 23 | | | 1 | 1 | 0 | Fail - Ignition wire should be 0 |
| 24 | | | 1 | 1 | 1 | Fail - Ignition wire should be 0 |
| 25 | | enabled | 0 | 0 | 0 | Pass |
| 26 | | | 0 | 0 | 1 | Fail - StarterEnable should be 0 |
| 27 | | | 0 | 1 | 0 | Fail - StarterDisable should be 0 |
| 28 | | | 0 | 1 | 1 | Fail - StarterEnable and StarterDisable should be 0 |
| 29 | | | 1 | 0 | 0 | Fail - Ignition wire should be 0 |
| 30 | | | 1 | 0 | 1 | Fail - Ignition wire should be 0 |
| 31 | | | 1 | 1 | 0 | Fail - Ignition wire should be 0 |
| 32 | | | 1 | 1 | 1 | Fail - Ignition wire should be 0 |

Table 1 also lists the content of test report messages that may result if the ignition state is off (states 17-32).

In a preferred embodiment, during normal operation of the vehicle after verifying installation, whenever the starter is engaged, the tracking device 18 detects the states of the four wires as discussed above (step 106, 118), and generates a report message indicating that the starter was engaged, either while enabled or while disabled. The report message also preferably includes an indication of the detected states of the four wires.

In some embodiments, the commands to disable or enable the starter originate from the central server 44. In other interpreted in accordance with the breadth to which they are fairly, legally, and equitably entitled.

What is claimed is:

1. A method for verifying that a vehicle tracking device has been correctly connected to a vehicle ignition, a vehicle starter motor, and a starter relay, wherein the starter relay has a starter disabled switch position and a starter enabled switch position, the method comprising:

(a) transmitting a starter disable command to the vehicle tracking device via a wireless communication network;

(b) in response to the starter disable command, the vehicle tracking device setting a starter relay control connection to a first state to control the starter relay to direct a starting voltage from the vehicle ignition to the starter disabled switch position;

(c) while the vehicle ignition is in a start position, monitoring:
the starter relay control connection;
a first voltage level on a first connection to the starter disabled switch position;
a second voltage level on a second connection to the starter enabled switch position; and
a third voltage level on an ignition connection to the vehicle ignition;

(d) generating a first report message indicating that the vehicle tracking device has been correctly connected based on the starter relay control connection being in the first state, the first voltage level being the starting voltage, the second voltage level not being the starting voltage, and the third voltage level being an ignition-on voltage; and (e) transmitting the first report message to a mobile communication device.

2. The method of claim 1 further comprising generating the report message to include an indication of the first voltage level, the second voltage level, and the third voltage level, and the state of the starter relay control connection.

3. The method of claim 1 further comprising sending a message via the wireless communication network to a mobile communication device of a person who is tasked with verifying that the vehicle tracking device has been correctly wired to the vehicle ignition, which message prompts the person to engage the vehicle starter motor.

4. The method of claim 1 further comprising:
(f) transmitting a starter enable command to the vehicle tracking device via the wireless communication network;
(g) in response to the starter enable command, the vehicle tracking device setting the starter relay control connection to a second state to control the starter relay to direct the starting voltage from the vehicle ignition to the starter enabled switch position;
(h) while the vehicle ignition is in the start position, monitoring:
the starter relay control connection;
the first voltage level on the first connection to the starter disabled switch position;
the second voltage level on the second connection to the starter enabled switch position; and
the third voltage level on the ignition connection;
(i) generating a second report message indicating the state of the starter relay control connection and the first, second, and third voltage levels; and
(j) transmitting the second report message to the mobile communication device.

5. The method of claim 1 further comprising generating the second report message to indicate that the vehicle tracking device has been connected correctly when the starter relay control connection is in the second state, the second voltage level is the starting voltage, the first voltage level is not the starting voltage, and the third voltage level is an ignition-on voltage.

6. A vehicle tracking device for installation in a vehicle having an ignition system and a starter relay connected to the ignition system for disabling and enabling a starter of the vehicle, the vehicle tracking device comprising:

a location sensor that generates location information indicating a location of the vehicle tracking device;
a wireless transceiver that wirelessly communicates information between the vehicle tracking device and a wireless communication network;
a starter disable/enable circuit that monitors connections between the vehicle tracking device and the ignition system of the vehicle and generates state information based on the connections, wherein the connections include an ignition connection, a starter relay control connection, a first connection to a starter disabled switch position of the starter relay, and a second connection to a starter enabled switch position of the starter relay, wherein states of the starter relay control connection comprise:
a first state in which the starter relay directs a starting voltage from the vehicle ignition system to the starter disabled switch position; and
a second state in which the starter relay directs the starting voltage from the vehicle ignition system to the starter enabled switch position;
a processor that receives the state information from the starter disable/enable circuit and generates a report message indicating that the vehicle tracking device has been correctly connected based on:
the starter relay control connection being in the first state, the first connection receiving the starting voltage, the second connection not receiving the starting voltage, and the ignition connection receiving an ignition-on voltage; or
the starter relay control connection being in the second state, the second connection receiving the starting voltage, the first connection not receiving the starting voltage, and the ignition connection receiving an ignition-on voltage; and
the wireless transceiver for communicating the report message via the wireless information network.

7. The vehicle tracking device of claim 6 wherein the wireless transceiver communicates a message via the wireless communication network to a mobile communication device of a person who is tasked with verifying that the vehicle tracking device has been correctly connected in the vehicle ignition, which message prompts the person to engage the vehicle starter.

8. The vehicle tracking device of claim 6 wherein the vehicle is a gasoline-powered vehicle, a gasoline/electric hybrid vehicle, or an electric vehicle.

9. An apparatus for verifying that a vehicle tracking device has been correctly connected to a vehicle ignition, a vehicle starter motor, and a starter relay, wherein the starter relay has a starter disabled switch position and a starter enabled switch position, the apparatus comprising:
a central server that is in communication with the vehicle tracking device via a wireless communication network, the central server executing instructions to:
send a starter disable command to the vehicle tracking device via the wireless communication network; and
send a message via the wireless communication network to a mobile communication device of a person who is tasked with verifying that the vehicle tracking device has been correctly connected to the vehicle ignition, which message prompts the person to put the vehicle ignition in a start position; and
the vehicle tracking device comprising:
a location sensor that generates location information indicating a location of the vehicle tracking device;

a wireless transceiver that receives the starter disable command via the wireless communication network;

a starter disable/enable circuit that,
in response to the starter disable command, sets a starter relay control connection to a first state in which the starter relay directs a starting voltage from the vehicle ignition to the starter disabled switch position of the starter relay, and while the vehicle ignition is in the start position, monitors connections between the vehicle tracking device and the ignition system of the vehicle and generates state information based on the connections, wherein the connections include an ignition connection, the starter relay control connection, a first connection to the starter disabled switch position of the starter relay, and a second connection to the starter enabled switch position of the starter relay; and a processor that receives the state information from the starter disable/enable circuit and generates a first report message indicating that the vehicle tracking device has been correctly connected based on the starter relay control connection being in the first state, the first connection receiving the starting voltage, the second connection not receiving the starting voltage, and the ignition connection receiving an ignition-on voltage, wherein the wireless transceiver communicates the first report message via the wireless information network.

10. The apparatus of claim 9 further comprising:

the central server for executing instructions to send a starter enable command to the vehicle tracking device via the wireless communication network; and the vehicle tracking device comprising:
the wireless transceiver for receiving the starter enable command via the wireless communication network;

the starter disable/enable circuit, in response to the starter enable command, setting the starter relay control connection to a second state in which the starter relay directs the starting voltage from the vehicle ignition to the starter enabled switch position of the starter relay;

the processor receiving the state information from the starter disable/enable circuit and generating a second report message indicating states of one or more of the connections; and the wireless transceiver communicating the second report message via the wireless information network.

11. The apparatus of claim 10 wherein the processor generates the second report message to indicate that the vehicle tracking device has been correctly connected when the starter relay control connection is in the second state, the second connection receives the starting voltage, the first connection does not receive the starting voltage, and the ignition connection receives an ignition-on voltage.

* * * * *